(12) United States Patent
Wang

(10) Patent No.: US 7,086,935 B2
(45) Date of Patent: Aug. 8, 2006

(54) CELLULOSE-CONTAINING POLISHING COMPOSITIONS AND METHODS RELATING THERETO

(75) Inventor: Hongyu Wang, Wilmington, DE (US)

(73) Assignee: Rohm and Haas Electronic Materials CMP Holdings, Inc., Wilmington, DE (US)

(*) Notice: Subject to any disclaimer, the term of this patent is extended or adjusted under 35 U.S.C. 154(b) by 77 days.

(21) Appl. No.: 10/996,663

(22) Filed: Nov. 24, 2004

(65) Prior Publication Data

US 2006/0111024 A1  May 25, 2006

(51) Int. Cl.
C09G 1/02 (2006.01)
C09G 1/04 (2006.01)

(52) U.S. Cl. ............... 451/41; 438/693; 51/307

(58) Field of Classification Search ............ 451/36, 451/41, 559; 438/689, 690, 691, 692, 693; 51/298, 302, 303, 307, 308, 309
See application file for complete search history.

(56) References Cited

U.S. PATENT DOCUMENTS

| | | | |
|---|---|---|---|
| 6,117,775 A | 9/2000 | Kondo et al. | |
| 6,326,299 B1 | 12/2001 | Homma et al. | |
| 6,562,719 B1 | 5/2003 | Kondo et al. | |
| 6,585,568 B1 | 7/2003 | Tsuchiya et al. | |
| 6,605,537 B1 | 8/2003 | Bian et al. | |
| 6,620,037 B1 | 9/2003 | Kaufman et al. | |
| 6,632,259 B1 | 10/2003 | Weinstein et al. | |
| 2003/0143848 A1* | 7/2003 | Steckenrider et al. | ....... 438/689 |
| 2003/0181345 A1 | 9/2003 | Bian | |
| 2003/0219982 A1 | 11/2003 | Kurata et al. | |
| 2003/0228763 A1 | 12/2003 | Schroeder et al. | |
| 2004/0023492 A1 | 2/2004 | Bian et al. | |
| 2004/0092102 A1 | 5/2004 | Li et al. | |
| 2005/0199589 A1* | 9/2005 | Hirabayashi et al. | ......... 216/88 |

FOREIGN PATENT DOCUMENTS

| | | |
|---|---|---|
| EP | 1 211 717 A1 | 6/2002 |
| EP | 1 223 609 A1 | 7/2002 |
| WO | WO 99/64527 A1 | 12/1999 |
| WO | WO 01/14496 A1 | 3/2001 |
| WO | WO 02/094957 A2 | 11/2002 |

* cited by examiner

Primary Examiner—Jacob K. Ackun Jr.
(74) Attorney, Agent, or Firm—Blake T. Biederman

(57) ABSTRACT

An aqueous composition is useful for chemical mechanical polishing of a patterned semiconductor wafer containing a nonferrous metal. The composition comprises an oxidizer, an inhibitor for the nonferrous metal, 0.001 to 15 weight percent of a water soluble modified cellulose, non-saccaride water soluble polymer, 0 to 15 weight percent phosphorus compound, 0.005 to 10 weight percent of a water miscible organic solvent, and water.

10 Claims, 1 Drawing Sheet

CELLULOSE-CONTAINING POLISHING COMPOSITIONS AND METHODS RELATING THERETO

BACKGROUND OF THE INVENTION

The invention relates to chemical mechanical polishing (CMP) of semiconductor wafer materials and, more particularly, to CMP compositions and methods for polishing metal interconnects on semiconductor wafers in the presence of dielectrics and barrier materials.

Typically, a semiconductor wafer is a wafer of silicon with a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

CMP processes often include multiple polishing steps. For example, a first step removes excess interconnect metals, such as copper at an initial high rate. After the first step removal, a second step polishing can remove metal that remains on the barrier layer outside of the metal interconnects. Subsequent polishing removes the barrier from an underlying dielectric layer of a semiconductor wafer to provide a planar polished surface on the dielectric layer and the metal interconnects.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To reduce dishing, polishing is performed at a lower polishing pressure. However, merely reducing the polishing pressure would require that polishing continue for a lengthened duration. However, dishing would continue to be produced for the entire lengthened duration.

U.S. Pat. No. 6,562,719 (Kondo) describes the use of ethanol, isopropyl alcohol, ethylene glycol, and methyl ethyl ketone in abrasive-free polishing compositions that do not contain abrasive. These compounds were added to increase the solubility of BTA.

There is a need for a method to reduce dishing of metal in trenches or troughs without lengthening the duration of the polishing operation. Furthermore, there is a need for polishing compositions that leave a surface clear of interconnect metal residue after a short second step polishing time are needed.

STATEMENT OF THE INVENTION

An aspect of the invention provides an aqueous composition useful for chemical mechanical polishing of a patterned semiconductor wafer containing a nonferrous metal comprising an oxidizer, an inhibitor for the nonferrous metal, 0.001 to 15 weight percent of a water soluble modified cellulose, non-saccaride water soluble polymer, 0 to 15 weight percent phosphorus compound, 0.005 to 10 weight percent of a water miscible organic solvent, and water.

Another aspect of the invention provides an aqueous composition useful for chemical mechanical polishing of a patterned semiconductor wafer containing a nonferrous metal comprising 0 to 25 weight percent oxidizer, 0.01 to 15 weight percent inhibitor for the nonferrous metal, 0.005 to 5 weight percent of a water soluble modified cellulose, 0.005 to 5 weight percent non-saccaride water soluble polymer, 0.05 to 10 weight percent phosphorus compound, 0.01 to 7.5 weight percent of a water miscible alcohol or ketone, 0.01 to 15 complexing agent, 0 to 3 weight percent abrasive and water.

Another aspect of the invention provides a method for CMP of a semiconductor wafer containing a metal comprising, a) contacting the wafer with a polishing composition, the polishing composition comprising an oxidizer, an inhibitor for the nonferrous metal, 0.001 to 15 weight percent of a water soluble modified cellulose, non-saccaride water soluble polymer, 0 to 15 weight percent phosphorus compound, 0.005 to 10 weight percent of a water miscible organic solvent, and water; and b) polishing the wafer with a polishing pad.

DETAILED DESCRIPTION

Figure 1:
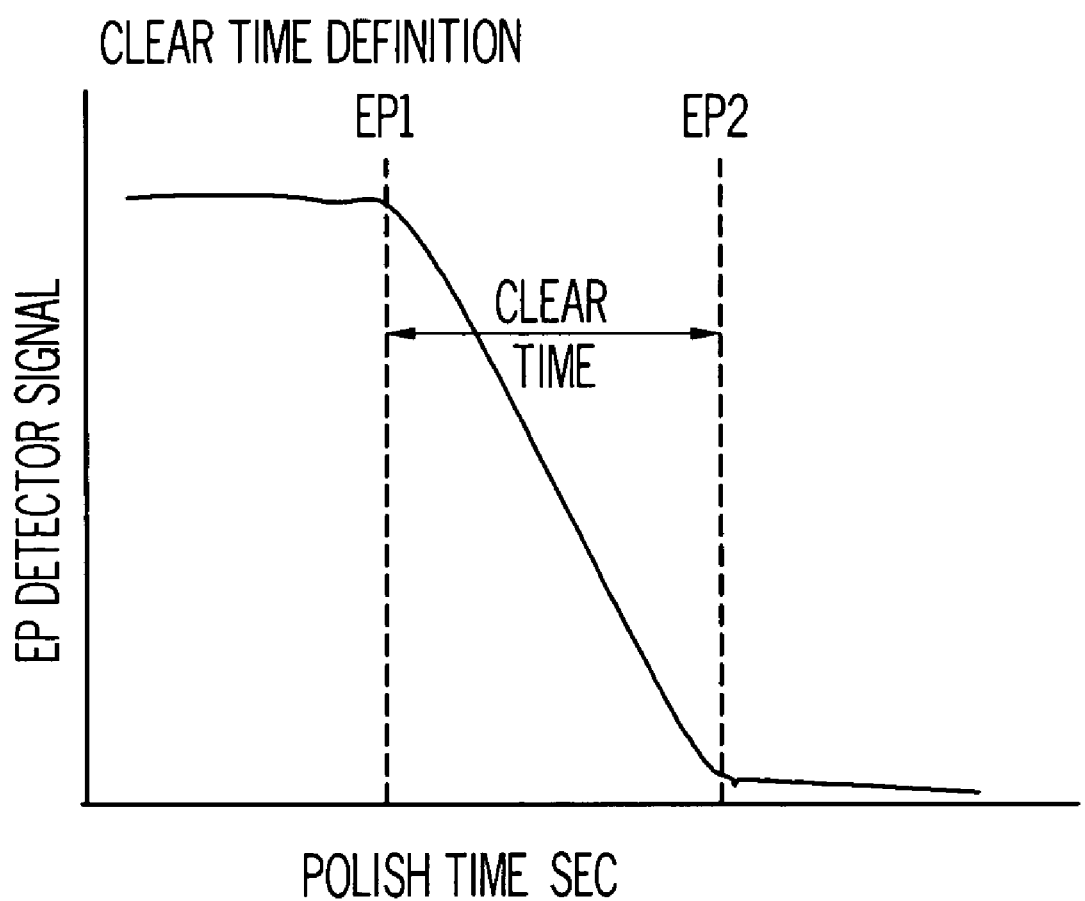
FIG. 1 is a graphical description of clear time.

The composition and method provide good metal removal rates and adequate metal clearing with ultra low dishing of the metal interconnects when a semiconductor wafer is exposed to CMP and a polishing composition containing a water miscible organic solvent and a water soluble modified cellulose. In particular, alcohols or ketones, in the presence of a modified cellulose compound, provides an acceptable metal removal rate and clearing of the nonferrous metal, such as copper, with low dishing. The composition may contain a non-saccaride water soluble polymer and optionally contains a phosphorus compound. Typically, such water miscible organic solvents are alcohols or ketones, such as at least one of methanol, ethanol, 1-propanol, 2-propanol, ethylene glycol, 1,2-propanediol, glycerol, acetone, and methyl ethyl ketone. Advantageously, the composition contains 0.005 to 10 weight percent of these organic solvents—this specification refers to all compositional ranges in weight percent. Preferably, the composition contains 0.01 to 7.5 weight percent of these organic solvents. Most preferably the composition contains 0.02 to 5 weight percent of these organic solvents.

The composition of the present invention utilizes 0.001 to 15 weight percent water soluble cellulose modified with carboxylic acid functionality and water miscible organic solvents such as alcohols and ketones. Although the present invention has particular usefulness in copper interconnects, the present aqueous polishing composition also provides enhanced polishing of other nonferrous metal interconnects, such as aluminum, gold, nickel, platinum group metals, silver, tungsten, and alloys thereof.

Preferably, the composition contains 0.005 to 5 weight percent of water soluble cellulose. Most preferably, the composition contains 0.01 to 3 weight percent of water soluble cellulose. Exemplary modified cellulose are anionic gums such as at least one of agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their derivatives and copolymers. The preferred water soluble cellulose, carboxy methyl cellulose (CMC), has a degree of substitution of 0.1 to 3.0 with a weight average molecular weight of 1K to 1000K. For purposes of this specification, molecular weight refers to cellulose in weight average molecular weight. More preferred, the CMC has a degree of substitution of 0.7 to 1.2 with a weight average molecular weight of 40K to 250K. Degree of substitution in CMC is the number of hydroxyl groups on each anhydroglucose unit in the cellulose molecule that is substituted. It can be considered as a measure of the "density" of carboxylic acid groups in the CMC.

The non-saccaride water soluble polymers of this invention include acrylic acid polymers, methacrylic polymers and copolymers synthesized utilizing acrylic acid monomer or methacrylic acid monomer. Copolymers include those formed from a combination of acrylic acid and methacrylic acid; and in particular, copolymers formed from an acrylic acid to methacrylic acid mole ratio in a range of 1:30 to 30:1; preferably in a range of 1:9 to 9:1; and most preferably about 2:3. The copolymer preferably has a weight average molecular weight in the range of 1K to 1000K; preferably in the range of 10K to 500K.

Alternatively, the non-saccaride water soluble polymer is an amphiphilic polymer, such as a copolymer formed from acrylic acid or methacrylic acid. The amphiphilic polymers referred to in this specification are block copolymers comprised of a hydrophobic segment and a hydrophilic segment. The hydrophobic segment can be polymeric chains with a carbon number varying from 2 to 250. For purposes of this specification, carbon number represents the number of carbon atoms in the hydrophilic segment. Preferably, the carbon number is 5 to 100 and most preferably 5 to 50. The hydrophilic segment is ionic. The number of monomeric units of the hydrophilic segment preferably varies from 1 to 100. Preferably, the composition contains 0.005 to 5 weight percent non-saccaride water soluble polymers. More preferably, the composition contains 0.01 to 3 weight percent non-saccaride water soluble polymers. Most preferably, the composition contains 0.02 to 2 weight percent of non-saccaride water soluble polymers.

The amphiphilic polymers' preferred number average molecular weight is 50 to 5,000—this specification refers to amphiphilic polymer in terms of number average molecular weight and specifically by aqueous gel permeation chromatography using TSK-GEL pn/08025 GMPWx and TSK-GEL pn/08020 G2500PWx columns in series with a refractive index detector and sodium phosphate buffer eluent. More preferably, the number average molecular weight is between 50 and 4,000 and most preferably the number average molecular weight is between 100 and 3,000. Ionic segments include cationic, anionic, and zwitterions (polyampholytes and polybetaines). Preferably, the hyprophilic segment is anionic such, as polyacrylic acid or a polymethacrylic acid. The hydrophilic segment preferably contains polyacrylic acid, polymethacrylic acid or a copolymer of acrylic acid and methacrylic acid. The combining of these segments into a copolymer produces molecules with properties different than their respective homopolymers that facilitate clearing without excessive dishing of metal interconnects. The hydrophobic end of the polymer may include hydrocarbon chains or an alkylmercaptan. Most preferably, the hydrophobic and hydrophilic segments combine in the form of a block copolymer.

The solution contains an oxidizer. Preferably, the solution contains 0 to 25 weight percent oxidizer. More preferably, the oxidizer is in the range of 5 to 10 weight percent. The oxidizer is particularly effective at assisting the solution in removing copper at low pH ranges. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. Furthermore, it is often advantageous to use a mixture of oxidizer compounds. When the polishing slurry contains an unstable oxidizing agent such as, hydrogen peroxide, it is often most advantageous to mix the oxidizer into the composition at the point of use.

Further, the solution contains an inhibitor to control removal of nonferrous metal, such as, copper interconnect removal rate by static etch or other removal mechanism. Adjusting the concentration of an inhibitor adjusts the interconnect metal removal rate by protecting the metal from static etch. Preferably, the solution contains 0.01 to 15 weight percent inhibitor. Most preferably, the solution contains 0.2 to 1.0 weight percent inhibitor. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole (TTA) and imidazole. Blends of azole inhibitors can increase or decrease copper removal rate. BTA is a particularly effective inhibitor for copper and silver.

In addition to the inhibitor, the composition optionally contains complexing agent for the nonferrous metal. The complexing agent may facilitate the removal rate of the metal film, such as copper. Preferably, the composition contains 0.01 to 15 weight percent complexing agent for the nonferrous metal. Most preferably, the composition contains 0.1 to 1 weight percent complexing agent for the nonferrous metal. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including, salts and mixtures thereof. Preferably, the complexing agent is selected from the group consisting of acetic acid, citric acid, ethyl acetoacetate, glycolic acid, lactic acid, malic acid, oxalic acid and mixtures thereof. Most preferably, the complexing agent is malic acid.

Optionally, the composition includes 0 to 15 phosphorus-containing compound. For purposes of this specification, a "phosphorus-containing" compound is any compound containing a phosphorus atom. A preferred phosphorus-containing compound is, for example, a phosphate, pyrophosphate, polyphosphate, phosphonate, including, their acids, salts, mixed acid salts, esters, partial esters, mixed esters, and mixtures thereof, for example, phosphoric acid. In particular, a preferred aqueous polishing composition can be formulated using, for example, the following phosphorus-containing compounds: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, including, their acids, salts, mixed acid salts, esters, partial esters, mixed esters, and mixtures thereof. Also, phosphine oxides, phosphine sulphides and phosphorinanes and of phosphonates, phosphites and phosphinates may be used, including, their acids, salts, mixed acid salts, esters, partial esters and mixed esters. A preferred phosphorus-containing compound is ammonium phosphate.

Advantageously, the phosphorus-containing compound of the polishing composition of the present invention is present in an amount effective to increase polishing rates at low down force pressures. It is believed that even a trace amount of the phosphorus-containing compound in the polishing composition is effective for polishing the copper. A satisfactory polishing rate at acceptable polishing down force pressures is obtained by using the phosphorus-containing compound in an amount of about 0.05 to about 10 weight percent of the composition. A preferred range for the phosphorus-containing compound is about 0.1 to about 5 weight percent of the composition. Most preferably, the phosphorus-containing compound is about 0.3 to about 2 weight percent of the composition.

The compounds provide efficacy over a broad pH range in solutions containing a balance of water. This solution's useful pH range extends from at least 2 to 5. In addition, the solution preferably relies upon a balance of deionized water to limit incidental impurities. The pH of the polishing fluid of this invention is preferably from 2 to 4, more preferably a pH of 2.5 to 4. The acids used to adjust the pH of the composition of this invention are, for example, nitric acid, sulfuric acid, hydrochloric acid, phosphoric acid and the like. Exemplary bases used to adjust the pH of the composition of this invention are, for example, ammonium hydroxide and potassium hydroxide.

Further, the polishing composition may optionally contain abrasive, such as, 0 to 3 weight percent abrasive to facilitate metal layer removal. Within this range, it is desirable to have the abrasive present in an amount of less than or equal to 1 weight percent. Most preferably, the polishing compositions are abrasive-free.

The abrasive has an average particle size of less than or equal to 500 nanometers (nm) for preventing excessive metal dishing, dielectric erosion and improving planarization. For purposes of this specification, particle size refers to the average particle size of the abrasive. More preferably, it is desirable to use a colloidal abrasive having an average particle size of less than or equal to 100 nm. Further, decreased dielectric erosion and metal dishing occur with colloidal silica having an average particle size of less than or equal to 70 nm. In addition, the preferred colloidal abrasive may include additives, such as dispersants, surfactants, buffers, and biocides to improve the stability of the colloidal abrasive. One such colloidal abrasive is colloidal silica from Clariant S.A., of Puteaux, France. Also, other abrasives, including, those that are fumed, precipitated, agglomerated, etc., may be utilized.

The polishing composition may include the abrasive for "mechanical" removal of metal interconnect layers. Example abrasives include inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Suitable inorganic hydroxide oxides include, for example, aluminum hydroxide oxide ("boehmite"). Modified forms of these inorganic oxides, such as, organic polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles, coated polymeric particles, and surfactant stabilized particles. The preferred abrasive, if utilized, is silica.

The composition of the present invention is applicable to any semiconductor wafer containing a conductive metal, such as copper, aluminum, tungsten, platinum, palladium, gold, or iridium; a barrier or liner film, such as tantalum, tantalum nitride, titanium, or titanium nitride; and an underlying dielectric layer. For purposes of the specification, the term dielectric refers to a semi-conducting material of dielectric constant, k, which includes low-k and ultra-low k dielectric materials. The composition and method are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The compositions of this invention may also be used for ECMP (Electrochemical Mechanical Polishing).

EXAMPLES

Example 1

In this Example, all compositions contain, by weight percent, 0.50 BTA, 0.22 malic acid, 0.32 carboxymethylcellulose (CMC), 0.1 acrylic acid/methacrylic acid copolymer (3:2 ratio, 23K molecular weight), 0.50 ammonium phosphate, and 9.00 hydrogen peroxide at a pH of 3.5—adjusted with nitric acid and balance distilled water.

An Applied Materials, Inc. Mirra 200 mm polishing machine equipped with an ISRM detector system using an IC1010™ polyurethane polishing pad (Rohm and Haas Electronic Materials CMP Inc.) under downforce conditions of about 2 psi (13.8 kPa), a polishing solution flow rate of 150 cc/min, a platen speed of 80 RPM, and a carrier speed of 40 RPM planarized Cu wafers. A Kinik diamond abrasive disk conditioned the pad. In particular, the test determined the effect of the utilization of alcohols on the polishing rate, clear time, and residual copper clearing. For purposes of this specification, clear time represents EPD2–EPD1, where EPD1 is the initial endpoint detection time at which the first sign of barrier layer is detected through the copper layer. EPD2 is the detection time at which the detector sees only barrier layer. FIG. 1 graphically shows this definition of clear time.

CMP Inc.) under downforce conditions of about 2 psi (13.8 kPa), a polishing solution flow rate of 160 cc/min, a platen speed of 80 RPM, and a carrier speed of 75 RPM planarized the samples. A Kinik diamond abrasive disk conditioned the pad.

TABLE 2

| Slurry | Alcohol | Cu Removal Rate (Å/min) | Dishing 90% (Å) | Dishing 50 μm (Å) | Dishing 90/10 (Å) | Dishing 100/1 (Å) | Dishing 100 μm (Å) | Clear Time (s) EPD2-EPD1 |
|---|---|---|---|---|---|---|---|---|
| 2 | methanol | 4074 | 237 | 219 | 425 | 390 | 246 | 30 |
| 3 | 1-propanol | 3956 | 313 | 294 | 446 | 589 | 349 | 29 |
| 4 | 2-propanol | 4270 | 297 | 283 | 419 | 619 | 328 | 30 |
| 5 | 1,2-propandiol | 3895 | 305 | 288 | 466 | 512 | 349 | 30 |
| 6 | glycerol | 4892 | 350 | 329 | 554 | 813 | 408 | 27 |
| 7 | ethylene glycol | 3103 | 314 | 371 | 566 | 631 | 400 | 37 |
| 8 | methyl ethyl ketone | 2893 | 324 | 365 | 580 | 635 | 373 | 36 |
| 9 | ethanol | 2888 | 302 | 347 | 570 | 597 | 356 | 35 |
| 10 | acetone | 5060 | 322 | 303 | 441 | 517 | 342 | 32 |

Note: Dishing values represent the average of the center, middle and edge of the wafer.

TABLE 1A

| Slurry | Dishing 90% (Å) | Dishing 50 μm (Å) | Dishing 90/10 (Å) | Dishing 100/1 (Å) | Dishing 100 μm (Å) |
|---|---|---|---|---|---|
| A | 505 | 511 | 1047 | 1356 | 619 |
| 1 | 237 | 219 | 425 | 390 | 246 |

Note:
Dishing values represent the average of the center, middle and edge of the wafer.

Table 1A illustrates that methyl alcohol provides a significant improvement in dishing performance.

TABLE 1B

| Slurry | Methyl Alcohol (wt %) | Cu Removal Rate (Å/min) | Clear Time(s) EPD2–EPD1 |
|---|---|---|---|
| A | 0 | 3810 | 100* |
| 1 | 1.00 | 4074 | 70 |

*Estimated

Table 1B illustrates that methyl alcohol provides a significant improvement in copper removal rate and wafer clear time.

Example 2

In this Example, all compositions contain, by weight percent, 0.50 BTA, 0.22 malic acid, 0.32 carboxymethylcellulose (CMC), 0.1 acrylic acid/methacrylic acid copolymer (3:2 ratio, 23K molecular weight), 1.00 water miscible organic solvent, 0.50 ammonium phosphate, and 9.00 hydrogen peroxide at a pH of 3.5—adjusted with nitric acid and balance distilled water.

The experiment measured copper polishing rates and determined the clearing of residual copper from a semiconductor wafer at a moderate down force pressure. An Applied Materials, Inc. Mirra 200 mm polishing machine equipped with an ISRM detector system using an IC1010™ polyurethane polishing pad (Rohm and Haas Electronic Materials As illustrated in Table 2, the addition of a water miscible organic solvent at about 1 weight percent in the polishing composition gives a good copper removal rate and clearing of residual copper with low dishing. The clear times for these samples were all less than 37 seconds.

The invention claimed is:

1. An aqueous composition useful for chemical mechanical polishing of a patterned semiconductor wafer containing a nonferrous metal comprising an oxidizer, an inhibitor for the nonferrous metal, 0.001 to 15 weight percent of a water soluble modified cellulose, non-saccharide water soluble polymer, 0 to 15 weight percent phosphorus compound, 0.005 to 10 weight percent of a water miscible organic solvent, and water.

2. The composition of claim 1 wherein the water miscible organic solvent contains an alcohol or ketone.

3. The composition of claim 1 wherein the water soluble modified cellulose is modified with a carboxylic acid functionality selected from at least one of carboxy methyl cellulose, agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their derivatives and copolymers.

4. The composition of claim 3 wherein the water soluble modified cellulose is carboxy methyl cellulose.

5. The composition of claim 1 wherein the composition is abrasive-free.

6. An aqueous composition useful for chemical mechanical polishing of a patterned semiconductor wafer containing a nonferrous metal comprising 0 to 25 weight percent oxidizer, 0.01 to 15 weight percent inhibitor for the nonferrous metal, 0.005 to 5 weight percent of a water soluble modified cellulose, 0.005 to 5 weight percent non-saccharide water soluble polymer, 0.05 to 10 weight percent phosphorus compound, 0.01 to 7.5 weight percent of a water miscible alcohol or ketone, 0.01 to 15 complexing agent, 0 to 3 weight percent abrasive and water.

7. The composition of claim 6 wherein the water soluble modified cellulose is carboxy methyl cellulose.

8. The composition of claim 6 wherein the non-saccaride water soluble polymer is a copolymer formed with acrylic acid or methacrylic acid.

9. The composition of claim 6 wherein the composition is abrasive-free.

10. A method for CMP of a semiconductor wafer containing a metal comprising, a) contacting the wafer with a polishing composition, the polishing composition comprising an oxidizer, an inhibitor for the nonferrous metal, 0.001 to 15 weight percent of a water soluble modified cellulose, non-saccaride water soluble polymer, 0 to 15 weight percent phosphorus compound, 0.005 to 10 weight percent of a water miscible organic solvent, and water; and b) polishing the wafer with a polishing pad.

* * * * *

(12) EX PARTE REEXAMINATION CERTIFICATE (9965th)
United States Patent
Wang

(10) Number: US 7,086,935 C1
(45) Certificate Issued: Nov. 27, 2013

(54) CELLULOSE-CONTAINING POLISHING COMPOSITIONS AND METHODS RELATING THERETO

(75) Inventor: Hongyu Wang, Wilmington, DE (US)

(73) Assignee: Rohm and Haas Electronic Materials CMP Holdings, Wilmington, DE (US)

Reexamination Request:
No. 90/012,426, Aug. 9, 2012

Reexamination Certificate for:
Patent No.: 7,086,935
Issued: Aug. 8, 2006
Appl. No.: 10/996,663
Filed: Nov. 24, 2004

(51) Int. Cl.
*C09G 1/02* (2006.01)
*C09G 1/04* (2006.01)
*B24B 37/04* (2012.01)
*H01L 21/321* (2006.01)

(52) U.S. Cl.
CPC .......... *B24B 37/044* (2013.01); *H01L 21/3212* (2013.01); *C09G 1/02* (2013.01); *C09G 1/04* (2013.01)
USPC ......... 451/41; 257/E21.304; 438/693; 51/307

(58) Field of Classification Search
None
See application file for complete search history.

(56) References Cited

To view the complete listing of prior art documents cited during the proceeding for Reexamination Control Number 90/012,426, please refer to the USPTO's public Patent Application Information Retrieval (PAIR) system under the Display References tab.

*Primary Examiner* — Timothy Speer

(57) ABSTRACT

An aqueous composition is useful for chemical mechanical polishing of a patterned semiconductor wafer containing a nonferrous metal. The composition comprises an oxidizer, an inhibitor for the nonferrous metal, 0.001 to 15 weight percent of a water soluble modified cellulose, non-saccaride water soluble polymer, 0 to 15 weight percent phosphorus compound, 0.005 to 10 weight percent of a water miscible organic solvent, and water.

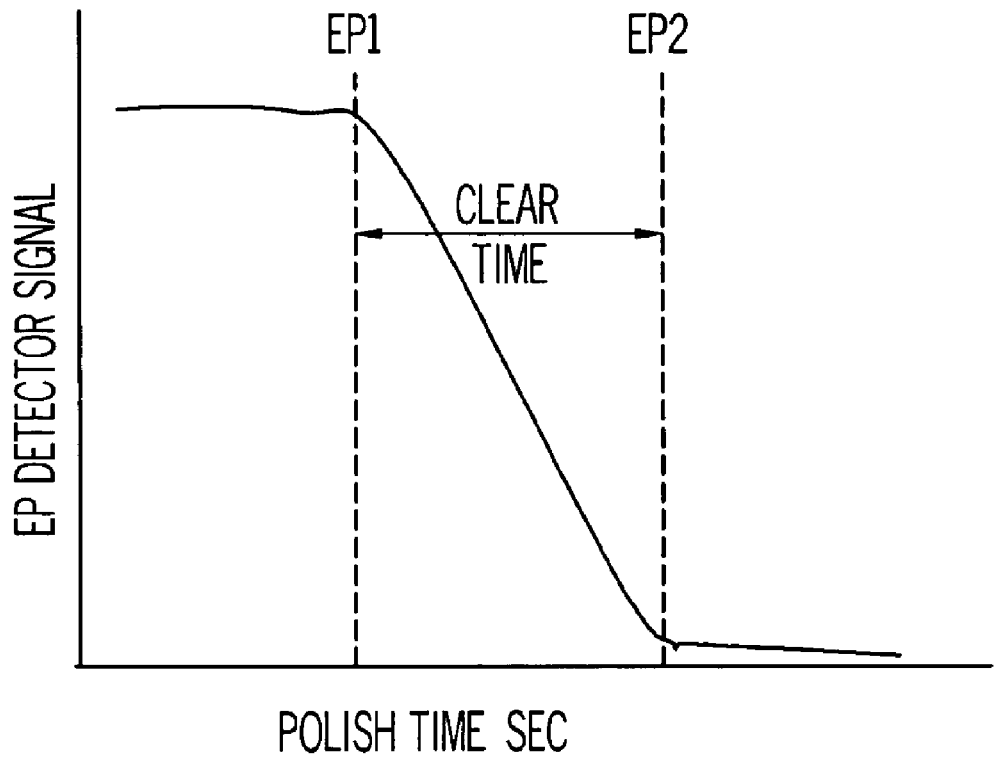

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2-5 and 7-9 are cancelled.

Claims 1, 6 and 10 are determined to be patentable as amended.

1. An aqueous composition useful for chemical mechanical polishing of a patterned semiconductor wafer containing a nonferrous metal comprising an oxidizer, [an] *0.2 to 1.0 weight percent of a benzotriazole* inhibitor for the nonferrous metal, 0.001 to 15 weight percent [of a water soluble modified cellulose] *carboxy methyl cellulose*, [non-saccaride water soluble polymer] *0.005 to 5 weight percent acrylic acid/methacrylic acid copolymer*, 0 to 15 weight percent phosphorus compound, 0.005 to 10 weight percent of a water miscible [organic solvent] *alcohol or ketone for increasing copper polishing rate and clearing copper from a barrier layer*, and water *wherein the composition is abrasive-free*.

6. An aqueous composition useful for chemical mechanical polishing of a patterned semiconductor wafer containing a nonferrous metal comprising 0 to 25 weight percent oxidizer, [0.01 to 15] *0.2 to 1.0* weight percent *of a benzotriazole* inhibitor for the nonferrous metal, 0.005 to 5 weight percent [of a water soluble modified cellulose] *carboxy methyl cellulose*, 0.005 to 5 weight percent [non-saccaride water soluble polymer] *acrylic acid/methacrylic acid copolymer*, 0.05 to 10 weight percent phosphorus compound, 0.01 to 7.5 weight percent of a water miscible alcohol or ketone *for increasing copper polishing rate and clearing copper from a barrier layer*, 0.01 to 15 complexing agent, [0 to 3 weight percent abrasive] and water *wherein the composition is abrasive-free*.

10. A method for CMP of a semiconductor wafer containing a metal comprising, a) contacting the wafer with a polishing composition, the polishing composition comprising an oxidizer, [an] *0.2 to 1.0 weight percent of a benzotriazole* inhibitor for the nonferrous metal, 0.001 to 15 weight percent [of a water soluble modified cellulose] *carboxy methyl cellulose*, [non-saccaride water soluble polymer] *0.005 to 5 weight percent acrylic acid/methacrylic acid copolymer*, 0 to 15 weight percent phosphorus compound, 0.005 to 10 weight percent of a water miscible [organic solvent] *alcohol or ketone for increasing copper polishing rate and clearing copper from a barrier layer*, and water *wherein the composition is abrasive-free*; and b) polishing the wafer with a polishing pad.

* * * * *